United States Patent
Horng et al.

(10) Patent No.: US 8,138,561 B2
(45) Date of Patent: Mar. 20, 2012

(54) STRUCTURE AND METHOD TO FABRICATE HIGH PERFORMANCE MTJ DEVICES FOR SPIN-TRANSFER TORQUE (STT)-RAM

(75) Inventors: Cheng T. Horng, San Jose, CA (US);
Ru-Ying Tong, Los Gatos, CA (US);
Chyu-Jiuh Torng, Pleasanton, CA (US);
Po-Kang Wang, Los Altos, CA (US);
Robert Beach, Los Gatos, CA (US);
Witold Kula, Cupertino, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 668 days.

(21) Appl. No.: 12/284,066

(22) Filed: Sep. 18, 2008

(65) Prior Publication Data
US 2010/0065935 A1    Mar. 18, 2010

(51) Int. Cl.
*H01L 29/82* (2006.01)
(52) U.S. Cl. .................. 257/421; 257/E21.665
(58) Field of Classification Search ............ 257/421, 257/295, E21.665, E21.001, E29.323; 428/811.1; 438/3
See application file for complete search history.

(56) References Cited

U.S. PATENT DOCUMENTS

| | | | |
|---|---|---|---|
| 6,990,014 B2 | 1/2006 | Hosomi et al. | |
| 7,208,807 B2 | 4/2007 | Horng et al. | |
| 7,262,064 B2 | 8/2007 | Ohba et al. | |
| 2006/0038246 A1* | 2/2006 | Maehara et al. | 257/421 |
| 2006/0042930 A1 | 3/2006 | Mauri | |
| 2006/0208296 A1* | 9/2006 | Horng et al. | 257/295 |
| 2007/0111332 A1 | 5/2007 | Zhao et al. | |
| 2007/0148786 A1 | 6/2007 | Horng et al. | |
| 2008/0061388 A1* | 3/2008 | Diao et al. | 257/421 |

OTHER PUBLICATIONS

"Current-driven excitation of magnetic multilayers," by J.C. Slonczewski, Journal of Magnetism and Magnetic Materials, vol. 159, L1-L7,(1996).
"Magnetization reversal by injection and transfer of spin: experiments and theory," by A. Fert et al., Journal of Magnetism and Magnetic Materials, vol. 272, p. 1706 (2004), found Sep. 25, 5008: http://www.sciencedirect.com/science.
"Spin transfer by nonuniform current injection into a nanomagnet," by O. Ozatay et al., Applied Physics Letters 88, 202502 1-3 (2006), American Institute of Physics.

(Continued)

*Primary Examiner* — Ha Tran T Nguyen
*Assistant Examiner* — Shaun Campbell
(74) *Attorney, Agent, or Firm* — Saile Ackerman LLC; Stephen B. Ackerman

(57) ABSTRACT

A STT-RAM MTJ is disclosed with a MgO tunnel barrier formed by a NOX process, a CoFeB/FeSiO/CoFeB composite free layer with a middle nanocurrent channel layer to minimize $Jc_0$, and a Ru capping layer to enhance the spin scattering effect and increase dR/R. Good write margin is achieved by modifying the NOX process to afford a RA less than 10 ohm-$\mu m^2$ and good read margin is realized with a dR/R of >100% by annealing at 330° C. or higher to form crystalline CoFeB free layers. The NCC thickness is maintained in the 6 to 10 Angstrom range to reduce Rp and avoid Fe(Si) granules from not having sufficient diameter to bridge the distance between upper and lower CoFeB layers. A FeSiO layer may be inserted below the Ru layer in the capping layer to prevent the Ru from causing a high damping constant in the upper CoFeB free layer.

10 Claims, 6 Drawing Sheets

OTHER PUBLICATIONS

"Currents, torques, and polarization factors in magnetic tunnel junctions," by Slonczewski, Physical Review B 71, 024411 1-10, (2005), The American Physical Society.

"A Novel Nonvolatile Memory with Spin Torque Transfer Magnetization Switching: Spin-RAM," by Hosomi et al., (2005) IEDM, paper 19-1.

"Composite free layer for high density magnetic random access memory with lower spin transfer current," by H. Meng et al., Applied Physics Letters vol. 89, 152509 1-3,( 2006).

"Perpendicular giant magnetoresistance and magnetic switching properties of a single spin valve with a synthetic antiferromagnet as a free layer," by Y. Jiang et al., Physical Review B, vol. 68, 224426 1-7, (2003).

"Enhanced Gilbert Damping in Thin Ferromagnetic Films," by Tserkovnyak et al., Physical Review Letters, vol. 88, No. 11, Mar. 18, 2002, 117601 1-4.

"Effective Reduction of Critical Current for Current-Induced Magnetization Switching by a Ru Layer Insertion in an Exchange-Biased Spin Valve," by Y. Jiang et al., Physical Review Letters, vol. 92, No. 16, week ending Apr. 23, 2004, 167204 1-4.

"Current-Driven Magnetization Switching in CoFeB/MgO/CoFeB Magnetic Tunnel Junctions," by Hayakawa et al., Japanese Journal of Applied Physics, vol. 44, No. 41, (2005), pp. L 1267-L 12700.

"2Mb Spin-Transfer Torque RAM (SPRAM) with Bit-by-Bit Bidirectional Current Write and Parallelizing-Direction Current Read," by Kawahara et al., ISSCC 2007 / Session 26 / Non-Volatile Memories / 26.5, 2007 IEEE, pp. 480-481 and 617.

"Magnetization reversal by injection and transfer on spin: experiments and theory," by A. Fert et al., APS/, arXiv:cond-mat/0310737v1 [cond-mat.mtrl-sci] , Oct. 30, 2003, pp. 1-6.

"Tunneling giant magnetoresistance in heterogeneous Fe-SiO2 granular films," by S. Honda et al., Physical Review B, vol. 56, No. 22, Dec. 1, 1997-II, pp. 14 566 to 14 573.

"230% room-temperature magnetoresistance in CoFeB/MgO/CoFeB magnetic tunnel junctions," by Djayaprawira et al., Applied Physics Letters, vol. 86, (2005), 092502 1-3.

Co-pending US Patent HMG07-042, U.S. Appl. No. 12/079,445, filed Mar. 27, 2008, "A Low Switching Current Dual Spin Filter (DSF) Element for STT-RAM and a Method for Making the Same," assigned to the same assignee as the present invention.

Co-pending US Patent HMG07-046/052, U.S. Appl. No. 12/082,155, filed Apr. 9, 2008, "A Low Switching Current MTJ Element for Ultra-High STT-RAM and a Method for Making the Same," assigned to the same assignee as the present invention.

* cited by examiner

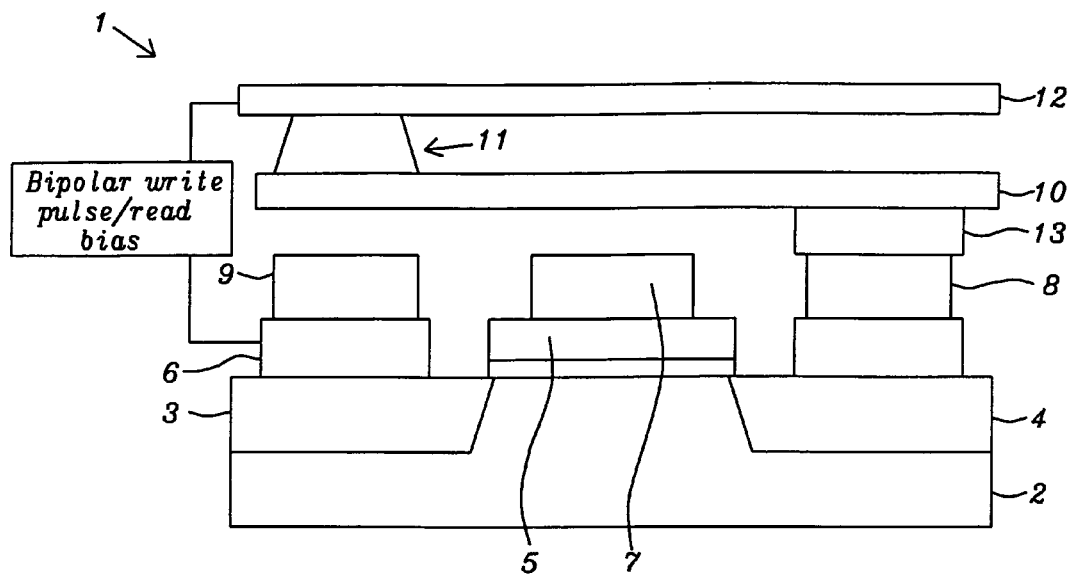
FIG. 1 - Prior Art
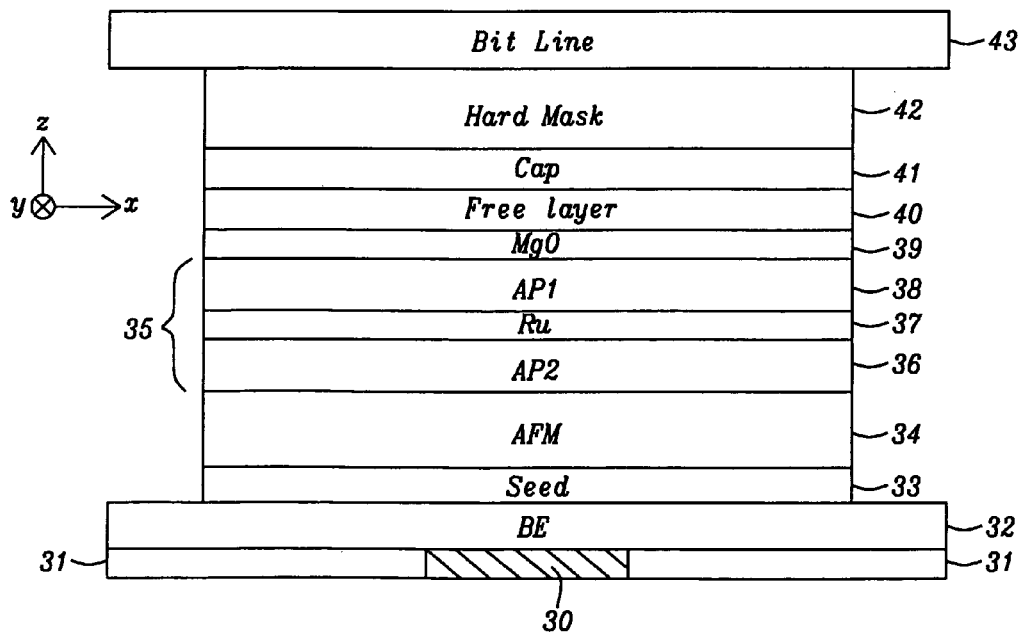
FIG. 2

STRUCTURE AND METHOD TO FABRICATE HIGH PERFORMANCE MTJ DEVICES FOR SPIN-TRANSFER TORQUE (STT)-RAM

RELATED PATENT APPLICATIONS

This application is related to the following: Ser. No. 12/079,445, filing date Mar. 27, 2008; and Ser. No. 12/082,155, filing date Apr. 9, 2008; both of which are assigned to a common assignee and are herein incorporated by reference in their entirety.

FIELD OF THE INVENTION

The invention relates to a high performance Magnetic Tunneling Junction (MTJ) element and a method for making the same, and in particular, to a spin transfer (Spin-RAM) device that achieves low switching current and high dR/R by incorporating a free layer having a FeCoB/FeSiO/FeCoB configuration in which the thinner, upper FeCoB layer is easier to switch than the lower, thicker FeCoB layer and the single MTJ functions like a dual spin filter (DSF).

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-RAM on a gigabit scale.

As shown in FIG. 1, one embodiment of a memory cell in a STT-RAM 1 includes a gate 5 formed above a p-type semiconductor substrate 2, a source 3, drain 4, word line (WL) 7 above the gate, and a source line 9. There is also a bottom electrode (BE) 10 formed above the source line 9 and word line 7, and a MTJ cell 11 between the BE and bit line (BL) 12. There is a Cu stud 6 connecting the source 3 to BL 12, and a via 13 and Cu stud 8 to connect BE 10 to drain 4. Thus, the transistor source 3 and drain 4 are connected to the MTJ 11 so that DC current may flow across the MTJ.

Both MRAM and STT-RAM have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The AFM layer holds the magnetic moment of the pinned layer in a fixed direction. The pinned layer has a magnetic moment that is fixed in the "x" direction, for example, by exchange coupling with the adjacent AFM layer that is also magnetized in the "x" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. One line (bit line) provides the field parallel to the easy axis of the bit while another line (digit line) provides the perpendicular (hard axis) component of the field. The intersection of the lines generates a peak field that is engineered to be just over the switching threshold of the MTJ.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_S$) value are desirable for conventional MRAM applications. For Spin-RAM (STT-RAM), a high $\lambda_S$ and high Hc leads to high anisotropy for greater thermal stability. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance x area (RA) value and a high breakdown voltage (Vb), it is necessary to have a uniform tunnel barrier layer which is free of pinholes that is promoted by a smooth and densely packed growth in the AFM and pinned layers. RA should be relatively small (<10000 ohm-$\mu m^2$) for MTJs that have an area defined by an easy axis and hard axis dimensions of less than 1 micron. Otherwise, R would be too high to match the resistance of the transistor which is connected to the MTJ.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

For STT-RAM to be viable in the 90 nm technology node and beyond, the ultra-small MTJs (also referred to as nanopillars or nanomagnets herein) must exhibit a TMR ratio that is much higher than in a conventional MRAM-MTJ which uses AlOx as the tunnel barrier and a NiFe free layer. Furthermore, the critical current density (Jc) must be lower than about $10^6$ A/cm$^2$ to be driven by a CMOS transistor that can typically deliver 100 μA per 100 nm gate width. A critical current for spin transfer switching (Ic), which is defined as $[(Ic^+ + Ic^-I)/2]$, for the present 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgOx, or the like. Thus, for high density devices such as STT-RAM on a gigabit scale, it is desirable to decrease Ic (and its Jc) by approximately an order of magnitude so as to avoid an electrical breakdown of the MTJ device and to be compatible with the underlying CMOS transistor that is used to provide switching current and to select a memory cell.

A. Fert et al. in "Magnetization reversal by injection and transfer of spin: experiments and theory", J. Magn. Magn. Materials, Vol. 272, p. 1706 (2004), point out that a larger reduction in switching current density may be realized with magnetic materials permitting high spin accumulations. Another type of spin transfer effect is described as a current-induced domain wall motion. Further, O. Ozatay et al. in "Spin transfer by nonuniform current injection into a nanomagnet", Appl. Phys. Lett., 88, 202502 (2006), state that current injected through nanochannels results in high current density which causes reverse domain nucleation. The domain wall will be pushed out by the continuous injection current until the entire free layer switches.

Once a certain MTJ cell has been written to, the circuits must be able to detect whether the MTJ is in a high or low resistance state which is called the "read" process. Uniformity of the TMR ratio and the absolute resistance of the MTJ cell are critical in MRAM (and STT-RAM) architecture since the absolute value of MTJ resistance is compared with a reference cell in a fixed resistance state during read mode. Needless to say, the read process introduces some statistical difficulties associated with the variation of resistances of MTJ cells within an array. If the active device resistances in a block of memory show a large resistance variation (i.e. high Rp_cov, Rap_cov), a signal error can occur when they are compared with a reference cell. In order to have a good read operation margin, TMR/Rp_cov (or Rap_cov) should have a minima of 12, preferably >15, and most preferably >20 where Rp is the MTJ resistance for free layer magnetization aligned parallel to pinned layer magnetization (which is fixed) and Rap is the resistance of free layer magnetization aligned anti-parallel to the pinned layer magnetization.

The intrinsic critical current density (Jc) as given by Slonczewski of IBM is shown in equation (1) below.

$$Jc = 2e\alpha Ms t_F (Ha + H_k + 2\pi Ms)/\hbar \eta \quad (1)$$

where e is the electron charge, α is a Gilbert damping constant, $t_F$ is the thickness of the free layer, $\hbar$ is the reduced Plank's constant, η is the spin-transfer efficiency which is related to the spin polarization (P), Ha is the external applied field, $H_k$ is the uniaxial anisotropy field, and 2πMs is the demagnetization field of the free layer. Two publications by C. Slonczewski that relate to STT-RAM are entitled "Current driven excitation of magnetic multilayers", J. Magn. Magn. Mater. V 159, L1-L7 (1996), and "Current, torques, and polarization factors in magnetic tunnel junctions", Physical Review B 71, 024411 (2005). In a MTJ structure (F/I/F) where F is a ferromagnetic layer and I is an insulator, when the spin relaxation distance is much larger than the ferromagnetic film thickness, the spin continuity holds true, i.e., the sum of interfacial torques from both left and right sides equals the net inflow of spin current. As the magnetization is fixed on one side, the other side magnetization will experience an in-plane torque of $T = -(\hbar P_L J_0/2e)\sin(\theta)$ where e is the electron charge, $P_L$ is tunneling polarization parameter, $J_0$ is electric current density, and θ is the angle between the magnetizations on the two sides of the tunnel barrier (insulator).

Normally, the demagnetizing field, 2πMs (several thousand Oe term) is much larger than the uniaxial anisotropy field Hk and external applied field (approximately 100 Oe) Ha term, hence the effect of Hk and Ha on Jc are small. In equation (2), V equals $Ms(t_F A)$ and is the magnetic volume which is related to the thermal stability function term $K_u V/k_b T$ where $K_u$ is the magnetic anisotropy energy and $k_b$ is the Boltzmann constant.

$$Jc \propto \alpha Ms V/\hbar \eta \quad (2)$$

Another publication relating to a STT-RAM (Spin-RAM) structure is by M. Hosomi et al. in "A novel non-volatile memory with spin torque transfer magnetization switching: Spin-RAM", 2005 IEDM, paper 19-1, and describes a 4 Kbit Spin RAM having CoFeB pinned and free layers, and a RF-sputtered MgO tunnel barrier that was annealed under 350° C. and 10000 Oe conditions. The MTJ size is 100 nm×150 nm in an oval shape. The tunnel barrier is made of crystallized (001) MgO with a thickness controlled to <10 Angstroms for a proper RA of around 20 ohm-um$^2$. Intrinsic dR/R of the MTJ stack is 160% although dR/R for the 100 nm×150 nm bit during read operation (with 0.1 V bias) is about 90% to 100%. Using a 10 ns pulse width, the critical current density, Jc, for spin transfer magnetization switching is around 2.5×10$^6$ A/cm$^2$. Write voltage distribution on a 4 Kbit circuit for high resistance state to low resistance (P to AP) and low resistance state to high resistance state (AP to P) has shown good write margin. Resistance distribution for the low resistance state (Rp) and high resistance state (Rap) has a sigma (Rp_cov) of about 4%. Thus, for a read operation, TMR (with 0.1 V bias)/Rp_cov is >20.

H. Meng and J. Wang in "Composite free layer for high density magnetic random access memory with low spin transfer current", APL Vol. 89, pp. 152509 (2006), fabricated two sets of MTJs. In a first MTJ represented by Si/SiO$_2$/BE/Ta/IrMn/CoFe/AlOx/CoFe30/Ta/top electrode, they employ a single CoFe free layer that is 30 Angstroms thick. In a second MTJ represented by Si/SiO$_2$/BE/Ta/CoFe20/FeSiO30/CoFe10/AlOx/CoFe/Ru/CoFe/IrMn/Ta/top electrode, there is a composite free layer with a nanocurrent channel (NCC) FeSiO layer sandwiched between two CoFe layers. RA values are 4.2 ohm-μm$^2$ and 7 ohm-μm$^2$, and TMR ratios are around 16.5% and 10% for the first MTJ and second MTJ, respectively. It is interesting to note that the Jc$_0$ value (by extrapolation) of 8×10$^6$ A/cm$^2$ for the second MTJ is about 33% that of the first MTJ (2.4×10$^7$ A/cm$^2$).

In two related publications by Y. Jiang et al., entitled "Perpendicular giant magnetoresistance and magnetic switching properties of a single spin valve with a synthetic antiferromagnet as a free layer", Phys. Rev. B, Vol. 68, p. 224426

(2003), and "Effective reduction of critical current for current-induced magnetization switching by a Ru layer insertion in an exchange-biased spin valve", PRL, V. 92, p. 167204 (2004), that relate to current induced magnetization switching (CIMS) in nanopillar CPP-GMR structures, a thin Ru layer formed on a CoFe free layer was found to considerably lower the critical current (Jc).

To reduce the resistance RA to ~10 ohm-μm$^2$ and minimize the chance of electrical breakdown, the thickness of MgO formed by RF magnetron sputtering of a MgO target was set at 8.5 Angstroms by J. Hayakawa et al. in "Current-driven magnetization switching in CoFeB/MgO/CoFeB magnetic tunnel junction", Japn. J. Appl. Phys., V 44, p. 1265 (2005). They noted that a CoFeB free layer is amorphous after 270° C. or 300° C. annealing but is crystalline following 350° C. annealing. Critical current density Jc with a 10 ns pulse width required for current driven switching was as low as $7.8 \times 10^5$ A/cm$^2$ for the 270° C. annealed sample.

T. Kawahara et al. in "2 Mb Spin-transfer Torque RAM with bit-by-bit directional current write and parallelizing-direction current read", 2007 IEEE International Solid State Circuits Conference, describe a STT-RAM having a CoFeB/RF sputtered MgO/CoFe—NiFe pinned/barrier/free layer configuration. MgO thickness is 10 Angstroms to give a RA of 20 ohm-μm$^2$. Annealing temperature is 350° C. and TMR is about 100%. Switching voltage for the 100 nm×50 nm oval MTJ using a 100 ns pulse is around 0.7 V.

The references above clearly indicate that spin-transfer-torque writing is a viable candidate for low power, high density non-volatile RAM. The MTJ structure for STT-RAM typically uses a CoFeB pinned layer, a RF sputter deposited MgO layer, and a CoFeB or CoFe/NiFe free layer. Note that nano-scale junctions of all the referenced MTJs were fabricated using electron beam lithography and ion beam etching (IBE) processes. However, the nanopillars formed by IBE results in MTJ elements with a sloping profile are not suitable for making very high density (Gbit) STT-RAMs. Further improvements are needed, and in particular, a nanoscaled MTJ that is made by optical lithography and reactive ion etch (RIE) processes to allow more vertical MTJ profiles, a high TMR ratio, a RA value of less than 15 ohm-μm$^2$, and a low Jc is desirable.

SUMMARY OF THE INVENTION

One objective of the present invention is to provide a MTJ for an STT-RAM that delivers a high dR/R of about 100% with a RA of less than about 15 ohm-μm$^2$, and achieves a low Jc$_0$ of about $2.5 \times 10^6$ A/cm$^2$ or less to facilitate magnetization switching of the free layer without negatively affecting the tunnel barrier layer.

A second objective of the present invention is to provide a fabrication method for forming a high density STT-RAM comprised of a MTJ according to the first objective.

According to one embodiment, these objectives are achieved by providing a substrate comprised of a bottom conductor electrode (BE) on which a spin-transfer (STT)-RAM structure is to be fabricated. The BE is preferably comprised of a TaN/NiCr/Ru/Ta configuration where the Ta layer is sputter etched to form a amorphous surface which promotes smooth and flat overlying layers in the MTJ. Once the BE is patterned to form an array of lines, a thin oxygen surfactant layer (OSL) is formed on the BE. Thereafter, a MTJ stack of layers is deposited on the BE/OSL stack. In one aspect, the MTJ stack has a bottom spin valve configuration in which a seed layer, AFM layer, pinned layer, tunnel barrier layer, free layer, and a capping layer/hard mask layer are sequentially formed on the BE/OSL. The seed layer is preferably NiCr and the AFM layer may be comprised of MnPt or IrMn, for example. Preferably, the pinned layer has a CoFe/Ru/CoFeB/CoFe or CoFe/Ru/CoFeB configuration where the former is used with an amorphous CoFeB free layer and the latter is employed with a crystalline CoFeB free layer.

The tunnel barrier layer is preferably comprised of crystalline MgO made by a natural oxidation method in order to minimize the RA value. A key feature is that the free layer is a composite comprised of a nanocurrent channel (NCC) layer such as FeSiO sandwiched between two Co$_{40}$Fe$_{40}$B$_{20}$ layers wherein the lower CoFeB layer is thicker than the upper layer. Preferably, there is a thin Ru capping layer formed on the free layer such that the Ru serves as a spin scattering layer. A Ta hard mask may be formed on the Ru capping layer to complete the MTJ stack of layers. In a second embodiment, the capping layer has a FeSiO/Ru configuration which is used to lower the damping constant of the upper CoFeB layer in the composite free layer.

All of the layers in the MTJ stack may be formed by sputtering or ion beam deposition (IBD). Once all the layers in the MTJ stack are laid down, a thermal anneal process may be employed to fix the pinned layer magnetization (easy-axis) direction. The MTJ stack is patterned with a photolithography step to define a MTJ shape in a photoresist masking layer followed by a RIE process to transfer the MTJ shape through the MTJ stack and form a MTJ nanopillar having essentially vertical sidewalls that enable highly dense MTJ arrays necessary for Gbit STT-RAM devices.

In one embodiment, a photoresist layer is formed on the hard mask and patterned to define an array of nanomagnet (MTJ) shapes from a top-view. Then a reactive ion etch (RIE) process is employed to etch through portions of the hard mask that are not covered by the photoresist layer. Thereafter, the first photoresist layer may be removed and a second RIE step is used to selectively etch through portions of the MTJ stack that are not protected by the hard mask. To complete the STT-RAM structure, a second dielectric layer such as silicon oxide is deposited on the MTJ element and surrounding substrate. A chemical mechanical polish (CMP) process is used to remove a top portion of the second dielectric layer thereby exposing the hard mask and making the second dielectric layer coplanar with the top of the MTJ element. A bit line array is then formed on the second dielectric layer by depositing a conductive layer followed by employing a photolithography patterning and RIE sequence to delineate a bit line on the hard mask.

BRIEF DESCRIPTION OF THE DRAWINGS

FIG. 1 is a cross-sectional view showing a memory cell in a conventional STT-RAM device.

FIG. 2 is a cross-sectional view of a STT-RAM with a MTJ nanopillar formed according to an embodiment of the present invention.

DETAILED DESCRIPTION OF THE INVENTION

Figure 3:
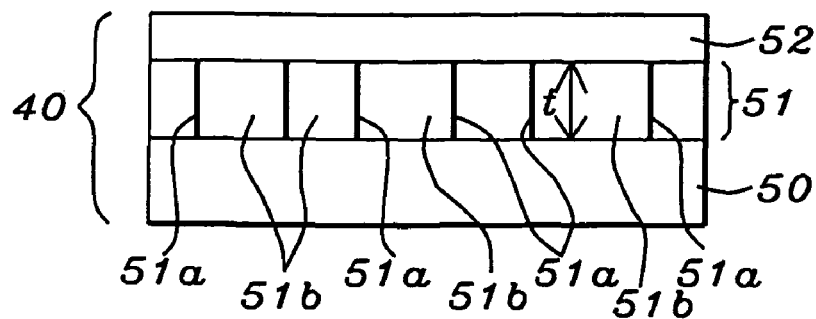
FIG. 3 is an enlarged cross-sectional view of the composite free layer in the MTJ nanopillar from FIG. 2 and depicts a nano-current channel layer formed therein.

The present invention is a MTJ element (nanopillar) for an STT-RAM application that provides a combination of high dR/R, low RA, and low critical current density which is necessary for enhanced performance in high density STT-RAMs. The present invention also provides a fabrication sequence for a STT-RAM on an ultra high density scale. Drawings are provided by way of example and are not intended to limit the scope of the invention. Although the exemplary embodiment depicts a bottom spin valve configuration, the present invention also encompasses a top spin valve design as appreciated by those skilled in the art. A "top view" as described herein is defined as a viewpoint from a position above the plane of the substrate in the STT-RAM device.

Referring to FIG. 2, one embodiment of a MTJ according to the present invention is depicted. In particular, a MTJ comprised of layers 33-42 is formed between a bottom electrode 32 and a bit line 43 in an MRAM array (not shown). The bottom electrode (BE) 32 may be a composite layer comprised of a lower seed layer, middle conductive layer, and upper capping layer. Preferably, the BE 32 has a TaN/NiCr/Ru/Ta configuration in which the lower TaN layer (not shown) is formed on a substrate that may be an insulation layer 31 comprised of silicon oxide or the like. The insulation layer 31 may have a metal stud 30 formed therein so that electrical contact can be established between bit line 43 and a word line (not shown) in a sub-structure below the substrate. In a preferred BE configuration, the thicknesses of the TaN, NiCr, Ru, and Ta layers are 30, 30, 100, and 120 Angstroms, respectively. However, the thickness of the various BE layers may be adjusted higher or lower to optimize performance as appreciated by those skilled in the art. The Ta layer (not shown) may be further subjected to sputter etching or ion milling to form an amorphous surface. Subsequently, an oxygen surfactant layer (OSL) may be formed on the α-Ta surface according to a method previously described in U.S. Pat. No. 7,208,807 which is herein incorporated by reference in its entirety.

An amorphous Ta top surface on BE 32 is especially advantageous in promoting a uniform and dense growth in subsequently formed MTJ layers. The most critical layers in the MTJ stack are the tunnel barrier 39 and free layer 40. The tunnel barrier 39 must be extremely uniform over the wafer since small variations in thickness will result in a large variation in the resistance and in the RA value. In one embodiment, the BE 32 is patterned to form an array of BE lines before depositing an OSL (not shown) on the BE. Then, an insulation layer (not shown) is deposited and planarized by a conventional method to become coplanar with BE 32 (or BE/OSL stack).

In the exemplary embodiment, the MTJ stack is fabricated on the patterned BE 32 by sequentially forming a seed layer 33, AFM layer 34, synthetic anti-ferromagnetic (SyAF) pinned layer 35, MgO tunnel barrier 39, free layer 40, capping layer 41, and hard mask layer 42. Seed layer 33 is preferably NiCr but may be comprised of NiFe, NiFeCr, or other suitable seed layer materials and has a thickness between 40 to 60 Angstroms. When a NiCr seed layer is grown on an oxygen surfactant treated α-Ta surface in the BE 32, a smooth and dense (111) NiCr crystal orientation results which promotes smooth and densely packed growth in subsequently formed MTJ layers.

The AFM layer 34 is preferably comprised of MnPt with a thickness in the range of 120 to 200 Angstroms although an IrMn layer about 50 to 100 Angstroms thick or other materials such as NiMn, OsMn, RuMn, RhMn, PdMn, RuRhMn, or MnPtPd are also acceptable. SyAF pinned layer 35 may have a AP2/coupling/AP1 configuration to improve thermal stability of the MTJ and also reduce the interlayer coupling Hin (offset) field applied to the free layer. Preferably, the AP2 layer 36 is made of CoFe, the coupling layer 37 is Ru, and the AP1 layer 38 is comprised of CoFeB/CoFe or CoFeB. In one embodiment, a CoFeB/CoFe AP1 layer 38 is used in combination with an amorphous CoFeB free layer 40. In another embodiment, a CoFeB AP1 layer 38 is employed in combination with a crystalline CoFeB free layer 40. As described in a later section, a crystalline CoFeB free layer preferably has a CoFeB/NCC/CoFeB configuration wherein the NCC (nano-conducting channel) layer may be substantially amorphous in character.

A critical feature of the present invention is the process of forming the MgO tunnel barrier 39. Unlike a method commonly used in the prior art references where a MgO tunnel barrier is deposited by RF magnetron sputtering directly from a sintered MgO target, we advantageously employ a procedure where a Mg layer about 6 to 8 Angstroms thick is DC-magnetron sputtered followed by an in-situ natural oxidation (NOX), and then sputter deposition of a second Mg layer about 3 to 5 Angstroms thick. Our method involving a DC sputtering process with a metallic Mg target results in a uniform Mg film that is particulate free. The desired RA value for the STT-RAM MTJ of less than about 15 ohm-$\mu m^2$ can be achieved by adjusting Mg thickness and NOX process conditions. Typically, the NOX process is performed in an oxidation chamber within a DC-magnetron sputter deposition tool and comprises an oxygen flow rate of 0.1 to 1 standard liters per minute (slm) for a period of 100 to 600 seconds. The oxygen pressure is about 1 torr. It is believed that the oxygen in the MgO layer resulting from the NOX process diffuses into the second Mg layer to form a uniform MgO layer in which essentially all of the first and second Mg layers are oxidized.

It is known by those skilled in the art that a MTJ made from a crystalline (001) MgO tunnel barrier and a CoFeB free layer is capable of delivering a very high dR/R that results from coherent tunneling in which electron symmetry of the ferromagnetic electrode is preserved in tunneling through the crystalline (001) MgO tunnel barrier. The most common CoFeB composition is represented by $[Co_xFe_{(1-x)}]_{80}B_{20}$ where the content of B is 20 atomic % and x is the atomic % of Co. The as-deposited CoFeB film has an amorphous phase structure and remains amorphous unless recrystallization occurs by annealing above 300° C. It should be understood that even though a CoFeB free layer has a somewhat higher intrinsic damping constant than a comparable CoFe free layer, a crystalline (100) CoFeB free layer resulting from annealing above 300° C. has a high polarization that leads to significantly higher dR/R than a CoFe free layer. Since a $Co_{40}Fe_{40}B_{20}$ alloy has a higher Fe content than a $Co_{60}Fe_{20}B_{20}$ alloy, the former has a higher polarization but lower damping factor than the $Co_{60}Fe_{20}B_{20}$ alloy. According to equation (2) presented previously, a free layer having higher polarization and lower damping constant results in lower switching current density Jc. Thus, a free layer 40 comprised of $Co_{40}Fe_{40}B_{20}$ alloy is preferred in the present invention.

In related patent application Ser. Nos. 12/079,445 and 12/082,155, we described a composite free layer having a CoFeB/FeSiO/CoFeB configuration in order to reduce $Jc_0$. In one aspect, a dual spin filter (DSF) structure may be employed to reduce $Jc_0$ but during fabrication of the DSF nanomagnets we observed considerable shorting in devices caused by patterning the nanomagnets by RIE. Although $Jc_0$ for a DSF nanomagnet may be lowered to about $2.5 \times 10^6$ A/cm$^2$, the dR/R was unfortunately reduced to 35% which is too low for STT-RAM. Thus, we were motivated to seek novel nanomagnets based on single spin valves where $Jc_0$ could be lowered to about $2.5 \times 10^6$ A/cm$^2$ while maintaining dR/R near 100%.

Referring to FIG. 3, free layer 40 is preferably a composite that includes a lower magnetic layer 50, a middle nanocurrent channel (NCC) layer 51 with a thickness t of 6 to 10 Angstroms, and an upper magnetic layer 52. The magnetic layers 50, 52 are preferably made of CoFeB having a low magnetic damping constant. Upper magnetic layer 52 has a smaller thickness of about 6 to 8 Angstroms compared with the lower magnetic layer 50 which has a thickness between 10 and 15 Angstroms. Therefore, the upper magnetic layer 52 is easier to switch than the lower magnetic layer 50.

Another important feature of the present invention is the middle NCC layer 51 made of RSiO or RSiN where R is Fe, Co, Ni, B, or an alloy thereof such as CoFeSiO, or a metal, and RSiO and RSiN are composites in which conductive R(Si) grains such as Fe(Si) are magnetically and electrically coupled with the adjacent magnetic layers 50, 52, and are formed in an amorphous silicon oxide (or silicon nitride) insulator matrix. The R(Si) grains such as Fe(Si) are typically formed in columnar shapes that may extend from the lower magnetic layer 50 to the upper magnetic layer 52. The two magnetic layers 50, 52 are ferromagnetically coupled and therefore have a magnetic moment in the same direction. For instance, the magnetization direction of magnetic layers 50, 52 may either be aligned parallel or anti-parallel to the magnetization direction of AP1 reference layer 38.

In the exemplary embodiment that has a CoFeB/FeSiO/CoFeB free layer 40 configuration and a Ru capping layer 41, the spin current in the FeSiO portion of the free layer passes only through the nano-conducting channels 51a within a silicon oxide matrix 51b. As a result, there is high current density about 9-fold greater than in typical free layers comprised of CoFeB which will cause reverse domain nucleation as described in the aforementioned Ozatay reference in which the domain wall will be pushed out by the continuous injection current until the entire free layer switches. Thermal heating caused by local current density may also contribute to magnetization switching in the two CoFeB layers. Moreover, the spin transfer mechanism described in the aforementioned Fert reference also contributes to magnetization reversal in an MTJ according to the present invention. Because of the existence of reverse magnetization grains in the NCC layer and their coupling to the CoFeB layers, the magnetization switching of the magnetic layers 50, 52 will be much easier than when a NCC layer is not present in the MTJ. In effect, the single spin valve (MTJ) described herein behaves like a DSF (but without a reduction in dR/R) in that the spin polarized current is reflected back from a free layer/cap layer interface and accumulates in the free layer. The enhancement of the transverse spin accumulation increases the spin torque and therefore effectively reduces the switching current.

In an embodiment where the NCC layer 51 is FeSiO, deposition is typically accomplished by RF-magnetron sputtering from a Fe(25 atomic %)-SiO$_2$ single target to provide an NCC thickness from 6 to 15 Angstroms, and preferably 6 to 10 Angstroms. According to S. Honda et al. in "Tunneling giant magnetoresistance in heterogeneous Fe—SiO$_2$ granular films", Phys. Rev. B. V 56, p 14566 (1997), the volume fraction (x) of the Fe(Si) granules in the SiO$_2$ matrix is calculated to be 0.115. The isolated Fe(Si) granules were found to have a diameter ranging from 10 to 20 Angstroms. We have set the lower limit of granule diameter distribution (10 Angstroms) as our process of record (POR)NCC layer 51 thickness in order to ensure uniformity in the NCC channels 51a between the two magnetic layers 50, 52. When the NCC thickness is greater than about 10 Angstroms, then some of the Fe(Si) granules fail to function as nano-current channels which leads to a high resistance in NCC layer 51 thereby increasing the RA of the MTJ with the composite free layer 40. High resolution transmission electron microscopy (HR-TEM) indicates a 10 Angstrom thick FeSiO layer 51 is grown as a continuous film that is flat and smooth similar to MgO tunnel barrier layer 39.

Above the free layer 40 is a cap layer 41 comprised of Ru having a thickness of 10 to 30 Angstroms, and preferably 30 Angstroms. A thin Ru capping layer 41 not only enhances dR/R but also considerably lowers the critical current $Jc_0$. A substantial reduction in Jc is believed to result primarily because the Ru layer serves as a strong spin scatterer for the majority of electrons which leads to an enhanced spin accumulation at the CoFeB layer 52/capping layer 41 interface. The enhanced spin accumulation will increase the polarized current inside the free layer and thus produce an additional spin torque to act on the CoFeB magnetization.

Figure 4:
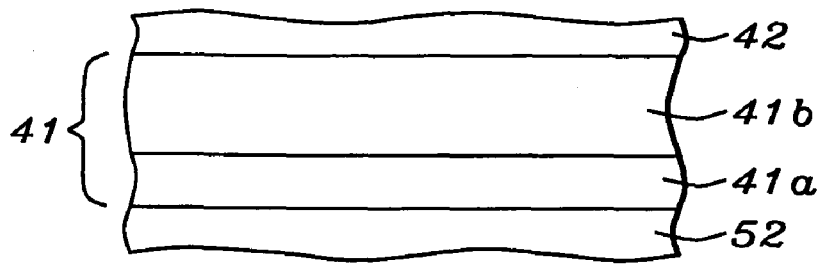
FIG. 4 is an enlarged cross-sectional view of a portion of a composite capping layer in a MTJ nanopillar according to one embodiment of the present invention.

In an alternative embodiment illustrated in FIG. 4, the cap layer 41 is a composite comprised of a lower FeSiO layer 41a about 5 to 6 Angstroms thick which contacts CoFeB layer 52, and an upper Ru layer 41b. A Ru capping layer can cause a sizable enhancement of the damping constant in an adjacent CoFeB free layer as presented by Y. Tserkovnyak et al. in "Enhanced Gilbert damping in thin ferromagnetic films", Phys. Rev. Lett., V 88, p 116601 (2002). Because of the relationship expressed in equation (2) mentioned previously, it is feasible to modify the free layer/cap structure so as to reduce the damping parameter of the upper CoFeB layer 52 in free layer 40 and thereby reduce the intrinsic critical current density (Jc) to a desirable value. We have discovered that reducing the NCC layer 51 thickness to 6 to 7 Angstroms and inserting a FeSiO layer 41a about 5 to 6 Angstroms thick as the lower layer in capping layer 41, the damping parameter of the upper CoFeB layer 52 is effectively lowered. Results will be described in a later section with regard to Table 3.

Figure 5:
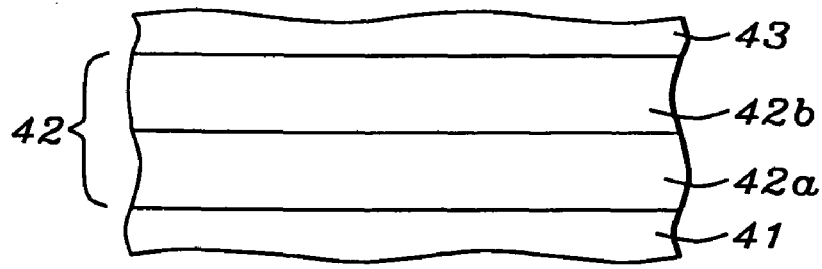
FIG. 5 is an enlarged cross-sectional view of a portion of a composite hard mask in a MTJ nanopillar according to an embodiment of the present invention.

Referring to FIG. 5, hard mask layer 42 may be a composite comprised of a lower MnPt layer 42a that contacts capping layer 41 and an upper Ta layer 42b on the MnPt layer. The MnPt/Ta configuration is designed especially for RIE processes used to pattern the MTJ nanopillars of this invention. Ta layer 42b thickness is from 300 to 500 Angstroms, and preferably 300 Angstroms, while MnPt layer 42a thickness is from 200 to 300 Angstroms, and preferably 250 Angstroms. The MnPt layer 42a is employed to avoid using a 600 Angstrom thick Ta hard mask which would require a thicker photoresist layer (lower pattern resolution) during the hard mask patterning process. Thus, the photoresist pattern (not shown) is transferred through the Ta layer 42b with a first RIE step. Thereafter, the photoresist layer is stripped and the pattern in the Ta layer is transferred through the MnPt layer 42a and underlying MTJ layers 33-41 with a second RIE step that has a substantially higher etch rate (relative to the Ta etch rate) than the first RIE step. The Ta upper layer 42b has sufficient thickness to prevent excessive thinning of the MTJ stack of layers during subsequent processing steps. It is well known that variations in MTJ stack height because of excessive thinning during a chemical mechanical polish (CMP) step, for example, can degrade device performance.

The bottom electrode layer 32 and MTJ layers 33-42 may be sequentially disposed on a substrate that is an insulation layer 31 made of silicon oxide, alumina, or the like and comprising a via stud 30. It should be understood that the via stud 30 is connected to a transistor drain (not shown) in an underlying sub-structure. The transistor is typically used in a write or read process that determines the resistance state of the bit cell (MTJ) once the MTJ stack of layers is patterned to form a MTJ nanopillar structure and a bit line is formed on the MTJ nanopillar. Note that unlike conventional MRAM, magnetization switching in a STT-RAM MTJ is accomplished by passing current through a bit cell and not by fields induced by current in a word line and a bit line. The bottom electrode 32 may have an area size in the "x, y" plane greater than that of overlying MTJ layers 33-42.

The MTJ stack comprised of layers 33-42 may be formed in the same process tool as the bottom electrode layer 32. For instance, the bottom electrode 32 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 32 and overlying MTJ layers 33-42 may be formed after a single pump down of the sputter system to enhance throughput. The NOX process used to form the MgO barrier layer 39 is typically performed in an oxidation chamber within the sputter deposition tool.

Once the MTJ stack of layers 33-42 is laid down on the patterned BE 32, a high temperature annealing may be performed. For example, MTJ layers 33-42 may be annealed in a vacuum by applying a magnetic field of 5000 to 10000 Oe in magnitude along the x-axis (easy axis) for 1 to 5 hours at a temperature of about 330° C. to 360° C.

Thereafter, an array of MTJ elements with essentially vertical sidewalls may be fabricated by a process involving a RIE process as mentioned previously. First, a photoresist layer (not shown) is coated on the hard mask 42 and then patterned by a conventional photolithography process. A pattern of islands is formed in the photoresist layer wherein each island corresponds to the desired ellipse shape or another shape of the MTJ nanopillar from a top view. The patterned photoresist layer then functions as an etch mask during a first reactive ion etch (RIE) process in a RIE system mainframe which removes uncovered regions of the Ta hard mask layer 42$b$. The photoresist layer may be stripped and a second RIE process is employed to selectively etch through regions of MnPt hard mask layer 42$a$, capping layer 41, and underlying MTJ layers 33-40 that are not protected by hard mask 42. As a result, the pattern of islands initially formed in the photoresist layer is transferred through the MTJ stack of layers to form an array of MTJ nanopillars. Since a RIE process is used to generate essentially vertical sidewalls in the MTJ nanopillars, a more dense array of MTJs is possible than when an ion beam etch (IBE) is employed as in the prior art.

Figure 8:
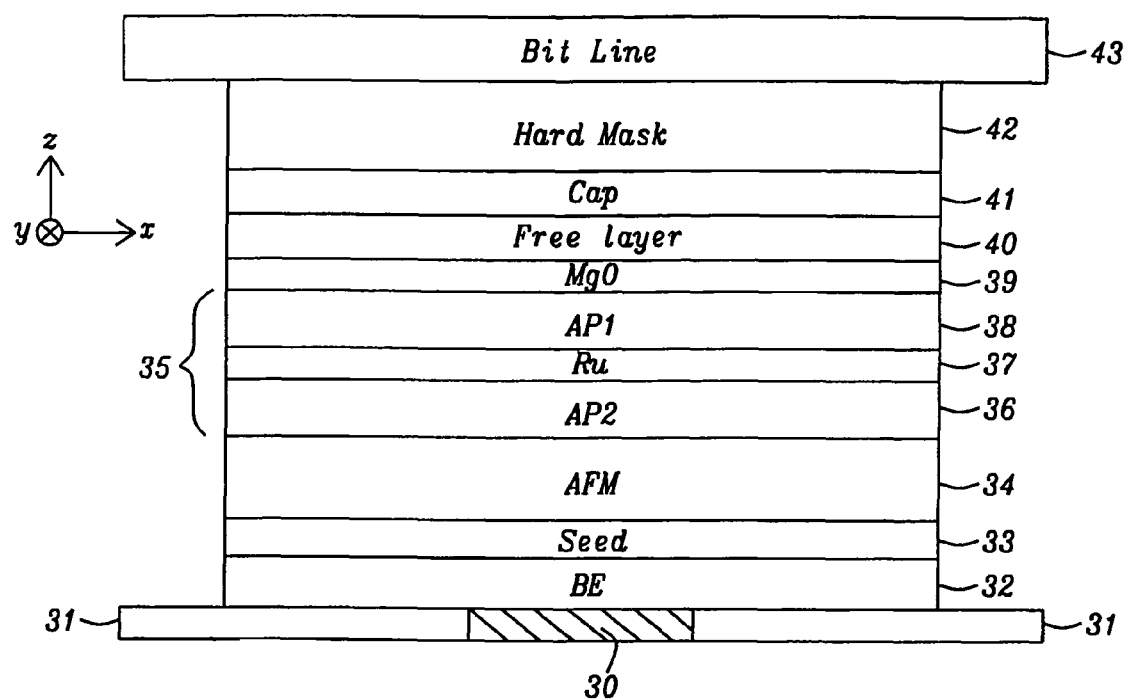
FIG. 8 is a cross-sectional view of a STT-RAM with a MTJ nanopillar formed according to a second embodiment of the present invention.

Referring to FIG. 8, the present invention anticipates an additional embodiment wherein the BE layer is not patterned before the MTJ stack of layers is deposited. Instead, the second etch process described above is extended so that the etch continues through the BE layer and forms a BE 32 having essentially the same shape from a top view as the overlying MTJ nanopillar. This embodiment allows a greater MTJ nanopillar density in the STT-RAM array than in the previous embodiment (FIG. 2). In this embodiment, a via stud (not shown) preferably contacts the lower surface of BE 32.

In both embodiments, following formation of an array of MTJ nanopillars, a second insulation layer (not shown) may be deposited on the BE 32 and/or substrate 31 to a level that fills in the spaces between adjacent MTJ nanopillars. A CMP process is used to remove an upper portion of the second insulation layer and thereby expose the hard mask layer 42. Thus, the second insulation layer becomes coplanar with the hard mask layer. Then a conductive material such as Cu, Al, or alloys thereof may be deposited on the second insulation layer and over the hard mask 42. Next, a bit line 43 that contacts the hard mask 42 is delineated by patterning the conductive layer using a well known photoresist patterning and etching sequence.

To determine the performance of a MTJ based on a prior art free layer and AP1 pinned layer combined with a MgO tunnel barrier made according to a method of the present invention, an unpatterned stack of layers represented by BE/NiCr45/MnPt150/$Co_{75}Fe_{25}$23/Ru7.5/AP1/Mg8-NOX—Mg4/free layer/cap was probed by CIPT and B—H looper and the resulting measurements are shown in Table 1. The MTJ stack for all configurations shown in Table 1 is formed on a NiCr45/Ru200/Ta150 bottom electrode and has a 100 Angstrom thick Ru capping layer which is used in this example only for the purpose of establishing good electrical contact for a CIPT measurement. The MgO layer was formed by first depositing an 8 Angstrom thick Mg layer followed by a NOX process (1 torr, 1 slm $O_2$ for 100 seconds) and then deposition of a 4 Angstrom thick Mg layer. Annealing was performed for 1 hour (10K Oe) at the indicated temperature.

TABLE 1

Magnetic Properties of MTJs with BE/NiCr45/MnPt150/$Co_{75}Fe_{25}$23/Ru7.5/AP1/Mg8(NOX)Mg4/free layer/cap configuration

| Row | AP1 | Anneal (1 hour) | Free layer | RA | MR | Bs | Hc | He | Hk |
|---|---|---|---|---|---|---|---|---|---|
| 1 | $Co_{60}Fe_{20}B_{20}$21 | 360 C. | $Co_{60}Fe_{20}B_{20}$20 | 9 | 166 | 0.62 | 11.5 | −10 | 40.3 |
| 2 | $Co_{40}Fe_{40}B_{20}$21 | 360 C. | $Co_{40}Fe_{40}B_{20}$20 | 10 | 180 | 0.65 | 12.3 | −9.2 | 39.5 |
| 3 | $Co_{40}Fe_{40}B_{20}$21 | 265 C. | $Co_{40}Fe_{40}B_{20}$20 | 10 | 91 | 0.49 | 9.6 | 6.5 | 33.6 |
| 4 | $Co_{40}Fe_{40}B_{20}$15-$CoFe_{25}$6 | 265 C. | $Co_{40}Fe_{40}B_{20}$20 | 9 | 103 | 0.55 | 11.0 | 3.7 | 34 |

Note that the free layer in row 1 is made of $Co_{60}Fe_{20}B_{20}$ which corresponds to the free layer in the Hosomi reference mentioned previously, and the $Co_{40}Fe_{40}B_{20}$ free layer in row 2 corresponds to that in the Hayakawa reference mentioned previously. For the 360° C. annealed MTJs, MR or dR/R (intrinsic) is at least equivalent to the values reported in the Hosomi and Hayakawa references. In rows 3 and 4 that are annealed at 265° C., the CoFeB free layer is mostly in the amorphous state which leads to a lower MR value than in rows 1 and 2. It should be pointed out that the AP1 in row 4 is comprised of amorphous $Co_{40}Fe_{40}B_{20}$ and crystalline $Co_{75}Fe_{25}$ wherein the crystalline $Co_{75}Fe_{25}$ interfaces with the MgO tunnel barrier to enhance dR/R compared with row 3.

In a related experiment, a MTJ nanopillar shown in row 4 where the $Co_{40}Fe_{40}B_{20}$ free layer is 18 Angstroms thick and the hard mask is MnPt300/Ta300 was fabricated in different sizes. Dimensions of the resulting devices referred to as D2 and D3 are 100 nm×150 nm (oval) and 100 nm×200 nm (oval), respectively. As measured by quasistatic (i.e. $\tau_a$~30 ms) testing, Rp for the D2 nanomagnet is around 1000 ohms and Vbd (breakdown voltage) is around 800-850 mV. Hc is about 100 Oe and Ho (offset field) is approximately 0 for the D2 nanomagnet. Note that Hc~100 Oe in the 265° C. annealed nanomagnet is much higher than Hc<100 Oe shown in the Hayakawa reference for 270° C. and 300° C. annealed nanomagnets. Obviously, Hayakawa's $Co_{40}Fe_{40}B_{20}$ free layer is amorphous as claimed while the high Hc for the D2 device indicates the 265° C. annealed $Co_{40}Fe_{40}B_{20}$ free layer is at least partially recrystallized. This result was confirmed by HR-TEM which shows CoFeB is mostly amorphous with partial crystalline character for an 18 Angstrom thick $Co_{40}Fe_{40}B_{20}$ free layer deposited on NOX—MgO by a method described herein. It is believed that the MgO tunnel barrier formed by a NOX process on a Mg layer yields a crystalline and highly (001) oriented layer that can act as a template for CoFeB recrystallization. In the example of the 265° C. annealed CoFeB layer, it is most likely that the lower portion of the free layer contacting the MgO tunnel barrier is the CoFeB portion that has recrystallized.

The dR/R for the D2 nanomagnet is as high as 80% which is significantly higher than the 49% reported for Hayakawa's 270° C. annealed nanomagnet. This result tends to substantiate our claim that the CoFeB portion at the MgO/CoFeB free layer interface has been recrystallized. It should be understood that the 80% MR value for the patterned D2 device is not as high as the same MTJ configuration in an unpatterned stack (row 4 in Table 1). We observed the critical switching voltage (Vc+ for AP to P, Vc− for P to AP) for switching the nanomagnet with an 18 Angstrom thick $Co_{40}Fe_{40}B_{20}$ free layer to be about 0.7V. High speed (pulse width $\tau_a$ down to 100 μs, 100 ns, and 10 ns) measurements were made on the quasistatic "switchable" D2, D3 nanomagnets. At high speed ($\tau_a$=10 ns), Vc_ave measured for these nanomagnets is around 1.4 V while the Vbd is also increased to around 1.7 V. The value of the intrinsic switching current density $Jc_0^+$, $Jc_0^-$, according to equation $Jc(\tau)=Jc_0[1-k_BT/K_uV \ln(\tau/\tau_0)]$ can be obtained by extrapolating the switching current density $Jc^{+,-}$ to a pulse width of $\tau_0$=1 ns where $\tau_0$=1 ns is the inverse of the activation frequency. We found that $Jc_0$_ave, $(Jc_0^+ + Jc_0^-/2)$, is $7.0\times10^6$ A/cm$^2$ for the $Co_{40}Fe_{40}B_{20}$ nanomagnet. Thermal stability factor $K_uV/k_BT$ is around 42. However, $Jc_0$ of $7.0\times10^6$ A/cm$^2$ is too high for STT-RAM devices.

As mentioned previously, we have also fabricated a DSF nanomagnet to reduce $Jc_0$. In particular, a configuration (A)=BE/NiCr45/MnPt150/CoFe23/Ru7.5/CoFeB15-CoFe6 (AP1)/MgO—NOX/$Co_{40}Fe_{40}B_{20}$20/Cu30/CoFe20(pinned)/MnPt250/Ta(HM) and a configuration (B) which is BE/NiCr45/MnPt150/CoFe23/Ru7.5/CoFeB15-CoFe6 (AP1)/MgO—NOX/Fe3-$Co_{40}Fe_{40}B_{20}$9-Fe6/MgO—NOX/CoFe20(pinned)/MnPt250/Ta(HM) were made and evaluated. Although $Jc_0$ for the (A) nanomagnet and (B) nanomagnet was lowered to $4.0\times10^6$ A/cm$^2$ and $2.5\times10^6$ A/cm$^2$, respectively, the dR/R was unfortunately reduced to 40% and 35%, respectively.

Table 2 shows magnetic properties of MTJs comprised of a CoFeB/FeSiO/CoFeB free layer configuration, MgO (NOX) tunnel barrier, and a Ru capping layer according to one embodiment of the present invention. In this case, a $Co_{40}Fe_{40}B_2O/Co_{75}Fe_{25}$ AP1 pinned layer is employed because the CoFeB free layer in rows 1-7 remains amorphous after 265° C. annealing. In the unpatterned stacks, a CIPT measurement is taken to determine MR and no hard mask is required for the test. For rows 1 and 2, the MR values with an asterisk were measured on patterned MTJ nanomagnets having a MnPt/Ta configuration according to one embodiment of the present invention. The MTJ layers and thicknesses are listed in the header for Table 2. Annealing was performed with an applied field of 10000 Oe with the time and temperature indicated.

TABLE 2

Magnetic Properties of MTJs with BE/NiCr45/MnPt150/$Co_{75}Fe_{25}$24.5/Ru7.5/CoFeB15—CoFe6/Mg8(NOX)Mg4/free layer/Ru30(cap)

| Row | NOX | Anneal | Free layer | RA | MR | Bs | Hc | Hin | Hk |
|---|---|---|---|---|---|---|---|---|---|
| 1 | 1 torr, 1slm 300" | 265 C., 2 hr | CoFeB14/FeSiO15/CoFeB6 | 15 | 68/55* | 0.59 | 12.5 | 6.5 | 28.3 |
| 2 | 1 torr, 1slm 300" | 265 C., 2 hr | CoFeB14/FeSiO10/CoFeB6 | 12 | 78/63* | 0.60 | 13.3 | 7.9 | 33.0 |
| 3 | 1 torr, 1slm 300" | 265 C., 2 hr | CoFeB14/FeSiO8/CoFeB6 | 11 | 85 | 0.60 | 13.1 | 7.9 | 32.5 |
| 4 | 1 torr, 1slm 300" | 265 C., 2 hr | CoFeB14/FeSiO6/CoFeB6 | 10 | 101 | 0.60 | 13.3 | 6.5 | 35.1 |
| 5 | 1 torr, 1slm 300" | 265 C., 2 hr | Fe3/CoFeB12/FeSiO10/Fe6 | 12 | 96 | 0.60 | 13.0 | 10.6 | 32.0 |
| 6 | 1 torr, 1slm 100" | 265 C., 2 hr | CoFeB14/FeSiO10/CoFeB6 | 7 | 75 | 0.58 | 8.55 | 15.2 | 37.9 |
| 7 | 100 sccm, 600" | 265 C., 2 hr | CoFeB14/FeSiO10/CoFeB6 | 6 | 77 | 0.59 | 9.31 | 16.9 | 38.8 |
| 8 | 1 torr, 1slm 300" | 360 C., 1 hr | CoFeB14/FeSiO10/CoFeB6 | 12 | 127 | 0.65 | 22.2 | 6.5 | 34.6 |

Values with an asterisk (*) are those for patterned samples. All other results are for unpatterned samples. Our process of record (POR) NOX method is indicated by the NOX conditions listed in rows 1-5 where an 8 Angstrom thick Mg film is exposed to 1 torr oxygen pressure using a 1 slm $O_2$ flow rate for 300 seconds. Note that in rows 2-5, RA is more or less stabilized at about 11 ohm-μm$^2$ when the FeSiO thickness is maintained in the range of 6 to 10 Angstroms. As stated earlier with regard to the NCC layer 51 in FIG. 3, NCC thickness is preferably kept at or below the minimum Fe(Si) granule size which has been determined to be approximately 10 Angstroms. As indicated in row 1 of Table 2, RA increases and dR/R decreases for a thicker (15 Angstroms) FeSiO layer which means some of the Fe(Si) granules are not functioning as nanocurrent channels.

Nanomagnets were constructed from row 1 and row 2 MTJ configurations in Table 2. A hard mask layer comprised of MnPt300/Ta500 was formed on the Ru30 cap layer to facilitate the RIE process to pattern the MTJ stacks. For the D2 devices (100 nm×150 nm ovals), quasistatic testing shows Hc~100+/−25 Oe, Ho~0 Oe, Vbd~825+/−50 mV, and Vsw-ave~300 mV. Rp was measured for the D2 devices and is 1000 ohm and 1500 ohm, respectively, for the FeSiO10 MTJ and FeSiO15 MTJ. Rp_cov was around 4% for both of the D2 devices. As shown in the MR column of Table 2, dR/R of the nanomagnets is 63% and 55% for row 2 and row 1, respectively. High speed measurement down to 10 ns yielded Vc_ave~600 mV and Vbd increased to >1.6 V, thereby showing good write margin. $Jc_0$ for the row 2 nanomagnet was determined to be $2.5 \times 10^6$ A/cm$^2$, which is a 3× reduction compared with a single MTJ fabricated with a single CoFeB free layer ($7.0 \times 10^6$ A/cm$^2$) in the prior art.

Figure 7A:
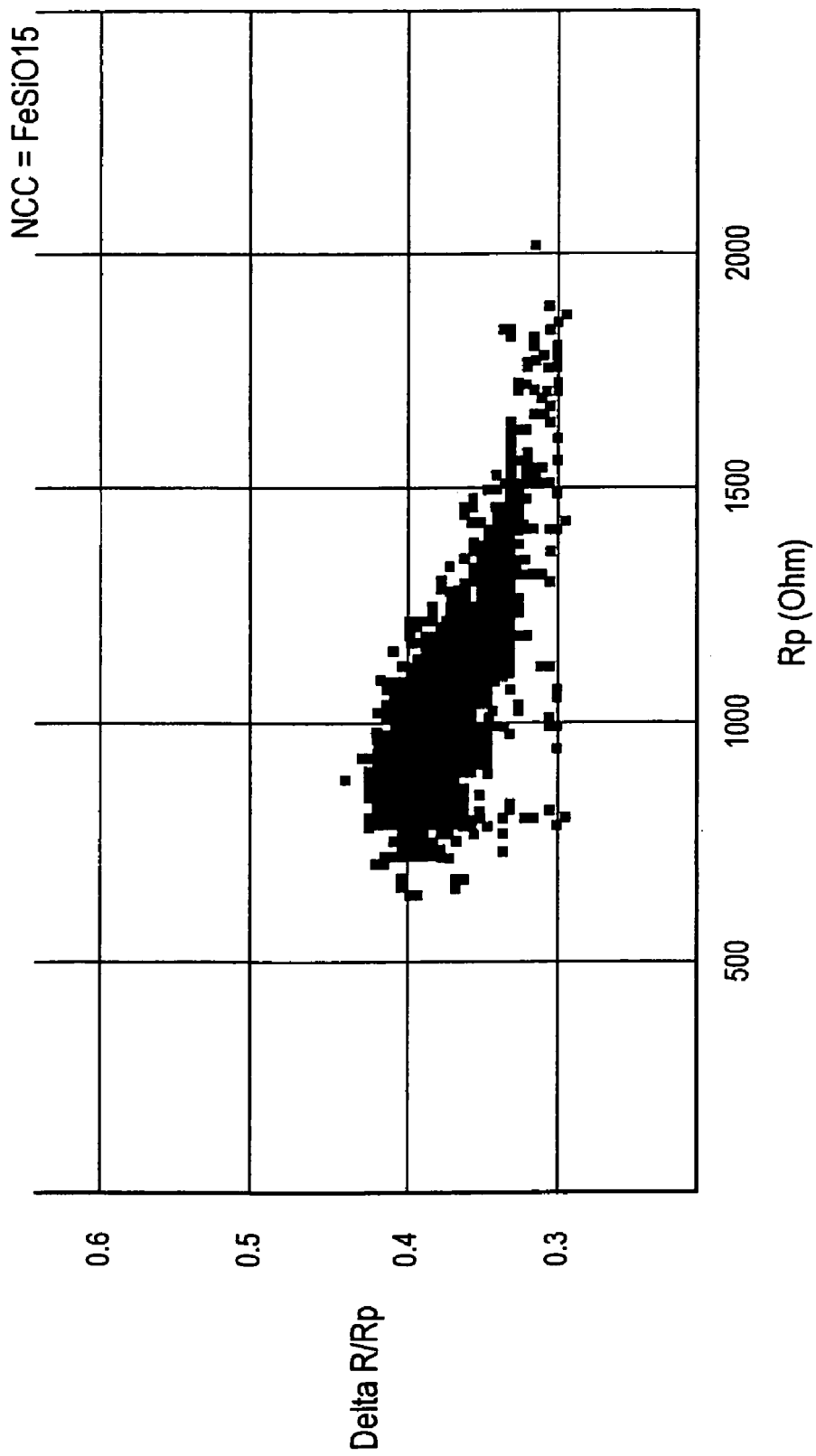
FIGS. 7a, 7b are graphs showing an Rp distribution in nanomagnets comprised of a CoFeB/FeSiO/CoFeB free layer.
Figure 7B:
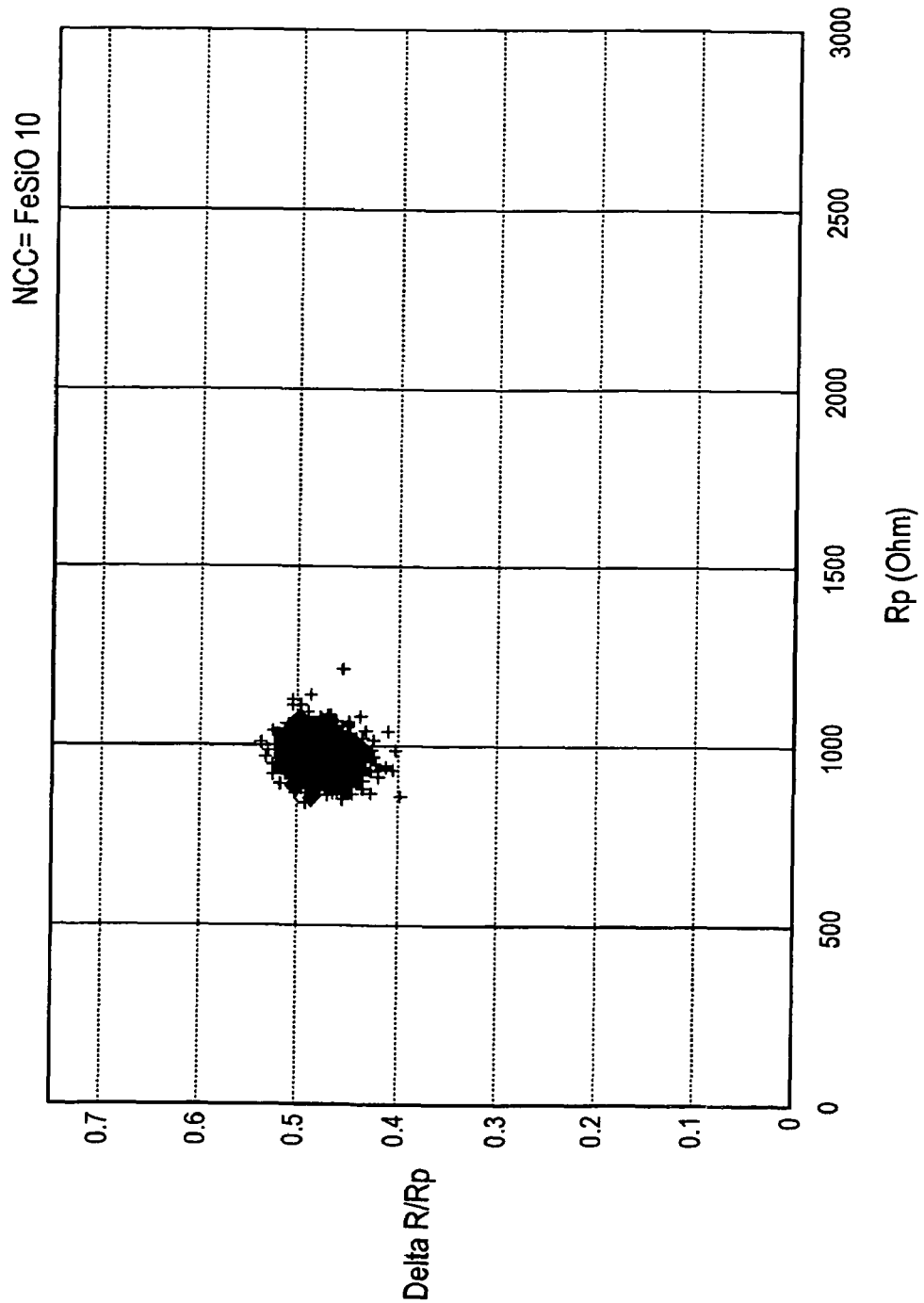

Using a 4 Kb STT-RAM circuit design, nanomagnets fabricated with a CoFeB14-FeSiO15-CoFeB6 free layer (MTJ 1) and a CoFeB14-FeSiO10-CoFeB6 free layer (MTJ 2) were studied. While MTJ (1) displayed a wide Rp distribution as illustrated in FIG. 7a, MTJ (2) is characterized as having a significantly narrower Rp distribution as depicted in FIG. 7b. In both FIG. 7a and FIG. 7b, delta R/Rp is uncorrected and has a sigma of 2%. Note that a dR/Rp of 0.49 means a dR/Rp of 49%. By correcting for transistor resistance which is about 170 ohm, the corrected dR/Rp for MTJ (2) should be 49%× (1000 ohm/1000 ohm−170 ohm)=59%. As mentioned previously, when FeSiO layers are formed thicker than 10 Angstroms which is the minimum size of Fe(Si) granules, some of the Fe(Si) granules fail to function as nano-conducting channels between upper and lower CoFeB layers thereby causing R to increase compared with a FeSiO layer in the 6 to 10 Angstrom thickness range.

Figure 6:
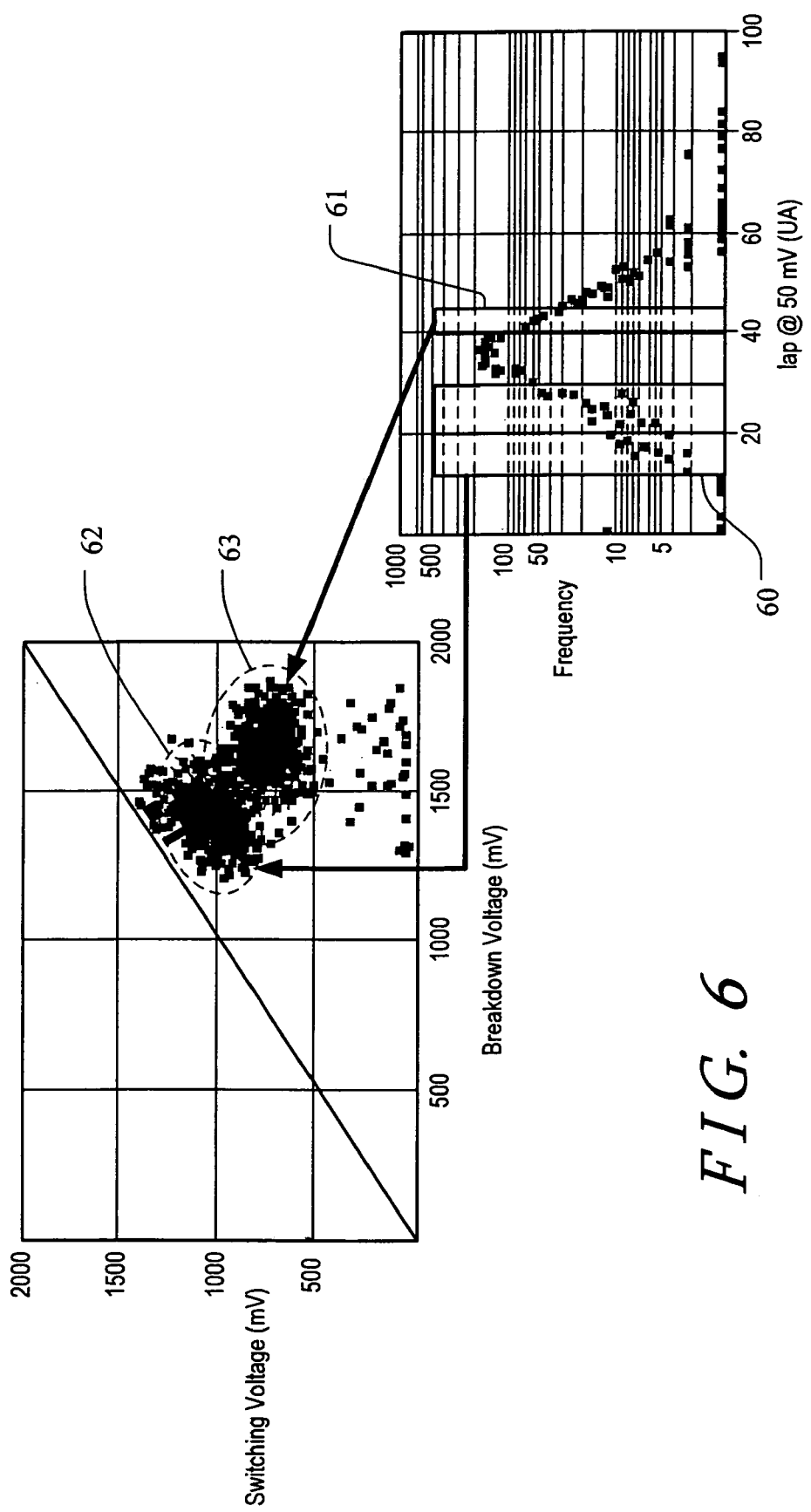
FIG. 6 is a drawing showing how devices with low R (high lap) in graph (a) relate to data points on graph (b) where switching voltage is plotted vs. breakdown voltage.

Referring to FIG. 6, anti-parallel current (Iap) is plotted vs. frequency for 4 Kb devices. Low R from MTJs having FeSiO layers in the 6-10 Angstrom thickness range correspond to high Iap values shown in rectangle 61 in the lower right plot. Data points in rectangle 61 translate to points within area 63 in the upper left graph where breakdown voltage (Vbd) is plotted vs. switching voltage (Vc). We find that devices with low R (high Iap) have tighter distribution and good write margin. It is desirable for a data point to be substantially below the diagonal line in the upper left plot so that switching voltage is considerably less than breakdown voltage. Devices with high R (low Iap) represented by data points within the larger rectangle 60 in the lower right graph have a wider distribution and poor write margin. Points within rectangle 60 translate to data points within area 62 in the upper left graph.

The conclusion derived from FIG. 6 and FIGS. 7a, 7b is that better write margin (i.e. well separation between Vc and Vbd) can be achieved in lower RA MTJs. Since Vc is proportional to Rp, it follows that Vc is reduced with lower RA MTJs. As shown in MTJs represented by rows 6 and 7 in Table II, we have discovered that using lower oxygen pressure or reducing oxidation time in the NOX process leads to a considerable reduction in RA. It is also important to note that lowering RA does not sacrifice dR/R. Using a 4 Kb STT-RAM circuit design, nanomagnets made of row 7 configuration with an RA of about 6 ohm-μm$^2$ were fabricated. We observed that Vc_ave was greatly reduced to ~400 mV while Vbd was not affected. Thus, we have demonstrated a good write margin in low RA devices.

The best Rp_cov in or STT-RAM devices is around 4% which is equivalent to that of the Hosomi reference in the prior art. For this STT-RAM, read margin (MR/Rp_cov) is 60%/4%=15, too low to be useful for STT-RAM product applications. To have a read margin>20 as desired, dR/R>100% is required. As indicated in row 8 of Table 2, dR/R (intrinsic)=127% is achieved for a MTJ comprised of a CoFeB/FeSiO/CoFeB free layer that is annealed using conditions comprised of 360° C. and 10K Oe annealing for 1 hour. This MR result would ensure an acceptable read margin>20 for product applications. Although RA increased to 12 ohm-μm$^2$ for this device, we have indicated earlier that the NOX process conditions may be modified to lower RA to 6 or 7 ohm-μm$^2$ without compromising dR/R.

According to a second embodiment of the present invention, a FeSiO layer may be inserted between the upper CoFeB free layer and the Ru cap layer to offset the tendency of Ru to enhance the damping constant of the adjacent CoFeB free layer. Table 3 shows the magnetic performance properties of a MTJ fabricated with a $Co_{40}Fe_{40}B_{20}14$/FeSiO6/$Co_{40}Fe_{40}B_{20}6$ (NCC) free layer that is capped by FeSiO6/Ru30. The FeSiO layer in the free layer is preferably thinned to about 6 to 7 Angstroms when a 5-6 Angstrom thick FeSiO layer is employed in the capping layer in order to minimize total FeSiO thickness in the MTJ stack and prevent R from increasing. Comparing row 2 to row 1, a high MR is maintained with a similar RA by annealing the MTJ with two FeSiO layers at 330° C. (10K Oe) for 1 hour.

TABLE 3

Magnetic Properties of MTJs with BE/NiCr45/MnPt150/Co$_{75}$Fe$_{25}$24.5/Ru7.5/CoFeB15—CoFe6/Mg8(NOX)Mg4/free layer/cap configuration

| Row | Free layer | Cap layer | Anneal (1 hour) | RA | MR | Bs | Hc | He | Hk |
|---|---|---|---|---|---|---|---|---|---|
| 1 | CoFeB14/FeSiO10/CoFeB6 | Ru30 | 360 C. | 12 | 127 | 0.65 | 22.2 | 6.5 | 34.6 |
| 2 | CoFeB14/FeSiO6/CoFeB6 | FeSiO6/Ru30 | 330 C. | 11 | 127 | 0.66 | 16.3 | −0.4 | 22.6 |

According to the present invention, the combination of a thin Ru or FeSiO/Ru capping layer, a MgO (NOX) tunnel barrier, and a composite free layer which includes a NCC layer sandwiched between two CoFeB layers where the top CoFeB layer is thinner than the bottom CoFeB layer results in a high dR/R with low critical current density $Jc_0$ as well as good write margin and read margin>20 that is necessary for STT-RAM product applications. This performance is an improvement over the prior art where not all of the aforementioned properties have been achieved at the same time. The CoFeB/FeSiO/CoFeB free layer and FeSiO/Ru capping layer can be readily implemented with existing tools and processes. A method has been provided such that the MTJ nanopillar design described herein can be easily reproduced.

While this invention has been particularly shown and described with reference to, the preferred embodiment thereof, it will be understood by those skilled in the art that various changes in form and details may be made without departing from the spirit and scope of this invention.

We claim:

1. A Magnetic Tunneling Junction (MTJ) nanopillar structure formed on a bottom electrode in a Spin Torque Transfer Random Access Memory (STT-RAM) device, comprising:
   (a) a seed layer formed on the bottom electrode;
   (b) an anti-ferromagnetic (AFM) layer formed on the seed layer;
   (c) a synthetic anti-ferromagnetic (SyAF) pinned layer with a second antiparallel (AP2)/coupling/first antiparallel (AP1) configuration formed on the AFM layer wherein the AP2 layer contacts the AFM layer;
   (d) a MgO tunnel barrier layer contacting the AP1 layer;
   (e) a composite free layer having a lower magnetic layer, an upper magnetic layer, and a middle nanocurrent channel (NCC) layer with magnetic channels connecting the upper and lower magnetic layers wherein NCC is a nanocurrent channel layer comprised of R(Si) grains having a minimum diameter that are formed in an oxide or nitride insulator matrix and R is Fe, Ni, Co, a metal M or a combination thereof, said lower magnetic layer contacting the MgO layer has a greater thickness than that of the upper magnetic layer and the NCC layer has a thickness which is less than or equal to the R(Si) grain minimum diameter; and
   (f) a capping layer disposed on the composite free layer.

2. The MTJ nanopillar structure of claim 1 wherein the bottom electrode is comprised of Ta or a composite layer with an uppermost Ta layer, and an oxygen surfactant layer (OSL) is disposed on the Ta layer, said seed layer contacts an upper surface of said OSL.

3. The MTJ nanopillar structure of claim 1 wherein the insulator matrix is $SiO_2$, the R(Si) grain minimum diameter is about 10 Angstroms, and the thickness of the NCC layer in the composite free layer is about 6 to 10 Angstroms.

4. The MTJ nanopillar structure of claim 1 wherein the lower magnetic layer in the composite free layer is CoFeB, and the upper magnetic layer is CoFeB or CoFe.

5. The MTJ nanopillar structure of claim 1 wherein the upper magnetic layer in the composite free layer has a thickness from about 6 to 8 Angstroms and the lower magnetic layer in the composite free layer has a thickness between about 10 and 15 Angstroms.

6. The MTJ nanopillar structure of claim 1 wherein the capping layer is comprised of a NCC layer that contacts the upper magnetic layer in the composite free layer, said NCC layer has a thickness from about 5 to 6 Angstroms.

7. The MTJ nanopillar structure of claim 1 wherein the capping layer is comprised of Ru, and a hard mask having a MnPt/Ta or Ta configuration contacts the capping layer.

8. The MTJ nanopillar structure of claim 7 wherein the MnPt layer has a thickness from about 200 to 300 Angstroms.

9. The MTJ nanopillar structure of claim 1 wherein the AP1 layer is CoFeB, CoFe, or a combination thereof.

10. The MTJ nanopillar structure of claim 4 wherein the lower magnetic layer in the composite free layer is CoFeB with a composition represented by $Co_{40}Fe_{40}B_{20}$.

* * * * *